(12) United States Patent
Chen et al.

(10) Patent No.: US 10,285,290 B2
(45) Date of Patent: *May 7, 2019

(54) ELECTRONIC DEVICE AND ADJUSTABLE FRAME THEREOF

(71) Applicant: WISTRON CORP., New Taipei (TW)

(72) Inventors: Kuang-Wen Chen, New Taipei (TW); Ching-Chen Chang, New Taipei (TW); Bin-Hua Zhou, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/793,766

(22) Filed: Oct. 25, 2017

(65) Prior Publication Data

US 2018/0049334 A1  Feb. 15, 2018

Related U.S. Application Data

(63) Continuation of application No. 15/003,052, filed on Jan. 21, 2016, now Pat. No. 9,913,390.

(30) Foreign Application Priority Data

Sep. 18, 2015  (CN) .......................... 2015 1 0599296

(51) Int. Cl.
*H05K 5/02* (2006.01)
*H05K 5/00* (2006.01)
*G06F 1/16* (2006.01)

(52) U.S. Cl.
CPC ......... *H05K 5/0217* (2013.01); *G06F 1/1633* (2013.01); *H05K 5/0004* (2013.01)

(58) Field of Classification Search
CPC .............. A45C 11/00; A45C 2011/002; A45C 2011/003; A45C 2013/025;
(Continued)

(56) References Cited

U.S. PATENT DOCUMENTS 5,657,884 A * 8/1997 Zilincar, III .......... A47F 5/0043
                                                    211/103
5,857,568 A * 1/1999 Speirs ................... G06F 1/1628
                                                    190/110
(Continued)

FOREIGN PATENT DOCUMENTS

CN      1839553 A      9/2006
TW      200913857 A    3/2009

OTHER PUBLICATIONS

CN Office Action in application No. 201510599296.8 dated Nov. 20, 2018.

*Primary Examiner* — Mandeep S Buttar
(74) *Attorney, Agent, or Firm* — Maschoff Brennan

(57) ABSTRACT

An adjustable frame includes a first support, a second support, two third supports and two assembling members. The second support is disposed on the first support, and the second support is slidable relative to the first support along a first direction. The two third supports are disposed on the first support. At least one of the two third supports is slidable relative to the first support along a second direction perpendicular to the first direction for adjusting a distance between the two third supports. The two assembling members are respectively disposed on the two third supports, and a distance between the two assembling members is adjustable by movement of the at least one of the two third supports.

17 Claims, 11 Drawing Sheets

US 10,285,290 B2

Page 2

(58) Field of Classification Search
CPC ............ G06F 2200/1633; F16M 13/02; F16M 11/24; B65D 81/02
USPC ............... 206/320, 576, 592, 521, 433, 305; 361/679.55, 679.57, 679.12
See application file for complete search history.

(56) References Cited

U.S. PATENT DOCUMENTS

| | | | | |
|---|---|---|---|---|
| 8,824,129 | B2* | 9/2014 | Wang ................... | G06F 1/1637 248/917 |
| 8,833,716 | B2* | 9/2014 | Funk ..................... | F16M 13/02 248/309.1 |
| 2005/0145528 | A1* | 7/2005 | Matias .................. | A45C 13/02 206/521 |
| 2007/0155451 | A1 | 7/2007 | Lee | |
| 2008/0164790 | A1* | 7/2008 | Tsang .................. | G06F 1/1616 312/223.2 |
| 2009/0073651 | A1* | 3/2009 | Hu ......................... | G06F 1/184 361/679.58 |
| 2009/0168339 | A1 | 7/2009 | Lee | |
| 2013/0148282 | A1* | 6/2013 | Chen .................... | G06F 1/1601 361/679.08 |
| 2016/0290553 | A1 | 10/2016 | Helmikkala | |

* cited by examiner

US 10,285,290 B2

ELECTRONIC DEVICE AND ADJUSTABLE FRAME THEREOF

CROSS-REFERENCE TO RELATED APPLICATIONS

This non-provisional application claims priority under 35 U.S.C. § 119(a) on Patent Application No(s). 201510599296.8 filed in China on Sep. 18, 2015, the entire contents of which are hereby incorporated by reference.

TECHNICAL FIELD

The disclosure relates to an adjustable frame and an electronic device, more particularly to a size adjustable frame and an electronic device having the adjustable frame.

BACKGROUND

With the development of the technology, the electronic devices, such as laptops, tablets and All-in-One PCs, have been popularized in recent years. The electronic devices can be used for editing documents, watching videos and playing media games. Generally, the manufacturer provides the electronic devices with different sizes, and the electronic device includes an output module, such as a display panel, an audio speaker, a light source and a touch panel. The size of the output module can be 22 inches, 24 inches and 27 inches so that the customer can choose a suitable product according to their requirements.

SUMMARY

According to the disclosure, an adjustable frame includes a first support, a second support, two third supports and two assembling members. The second support is disposed on the first support, and the second support is slidable relative to the first support along a first direction. The two third supports are disposed on the first support. One or more of the two third supports is slidable relative to the first support along a second direction perpendicular to the first direction for adjusting a distance between the two third supports. The two assembling members are respectively disposed on the two third supports, and a distance between the two assembling members is adjustable by movement of the one or more of the two third supports.

According to the disclosure, an electronic device includes a front case, a rear case, an output module and the aforementioned adjustable frame. The output module is disposed between the front case and the rear case. The output module includes a plurality of connecting members. The adjustable frame is disposed between the front case and the rear case, and the two assembling members are assembled to two of the plurality of connecting members, respectively.

BRIEF DESCRIPTION OF THE DRAWINGS

The present invention will become more understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
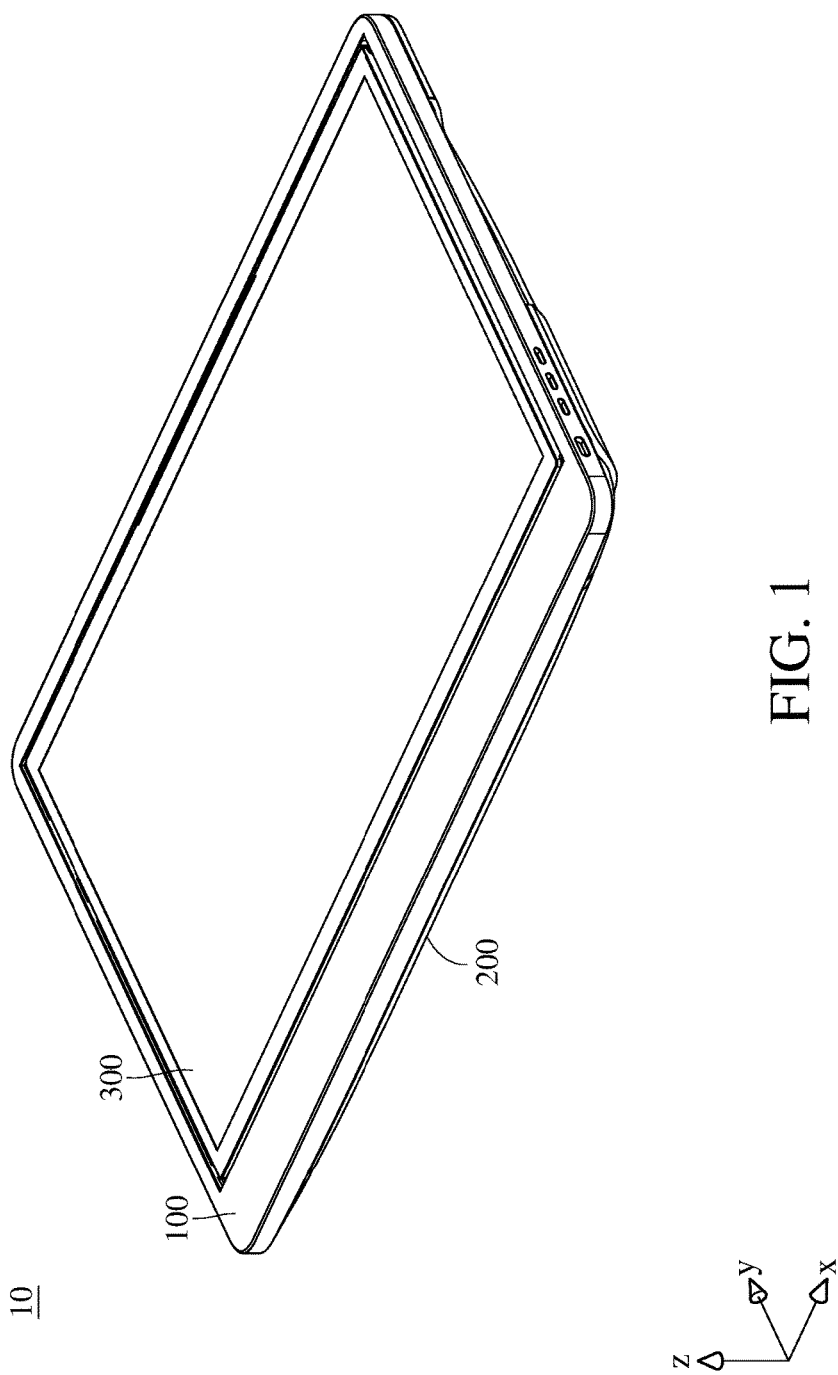
FIG. 1 is a perspective view of an electronic device according to a first embodiment.
Figure 2:
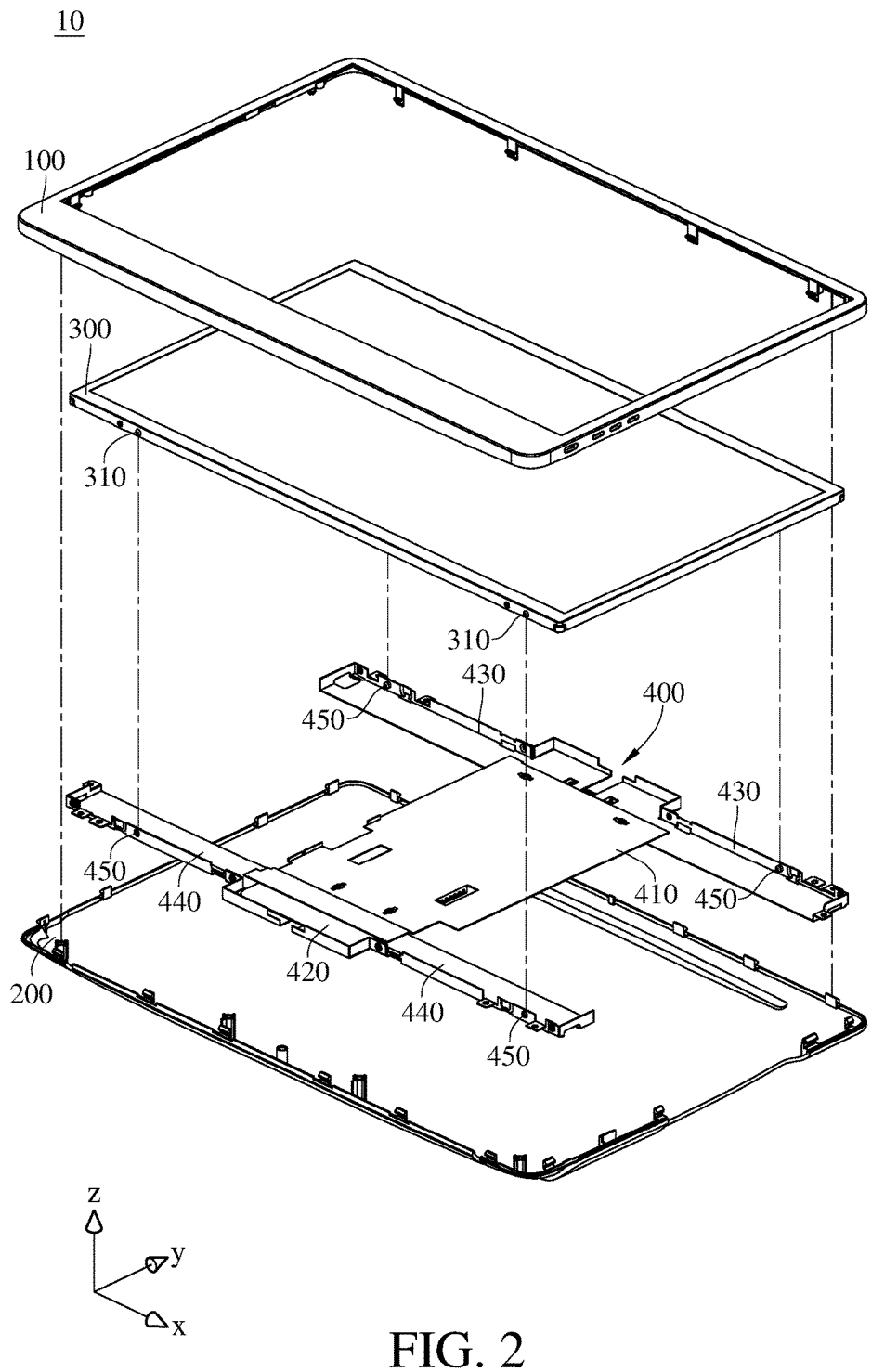
FIG. 2 is an exploded view of the electronic device in FIG. 1.
Figure 3:
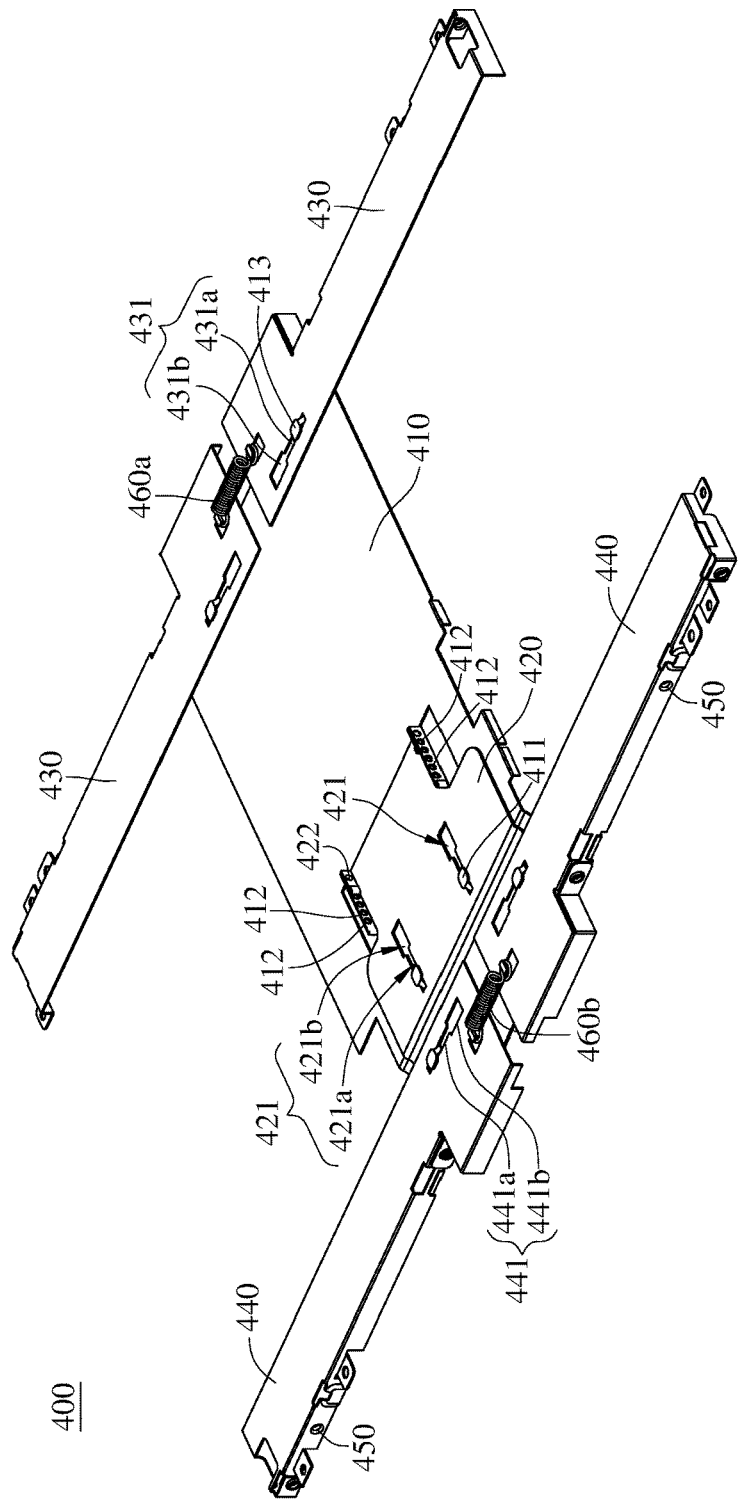
FIG. 3 is a perspective view of the adjustable frame in FIG. 2.
Figure 4:
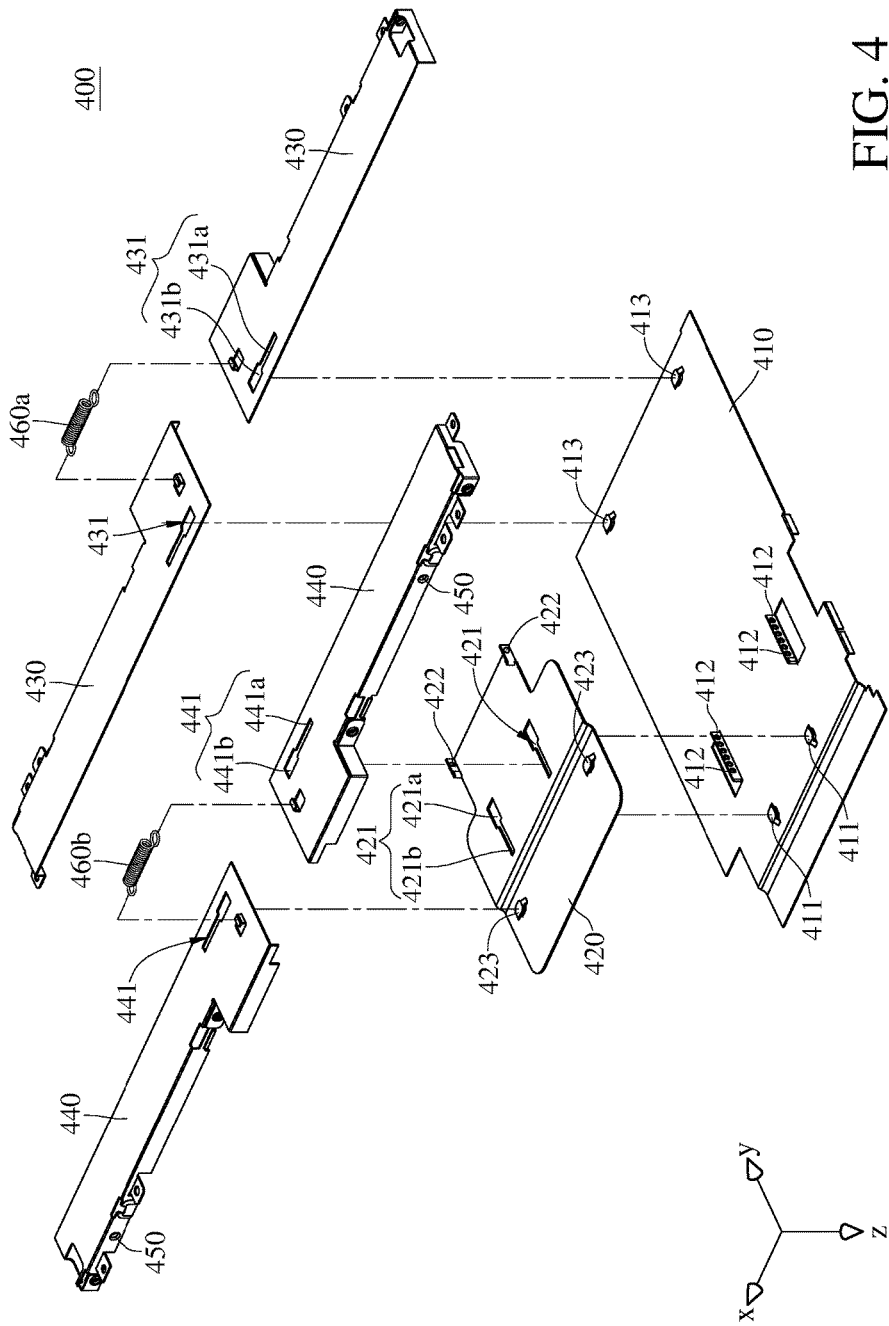
FIG. 4 is an exploded view of the adjustable frame in FIG. 3.
Figure 5:
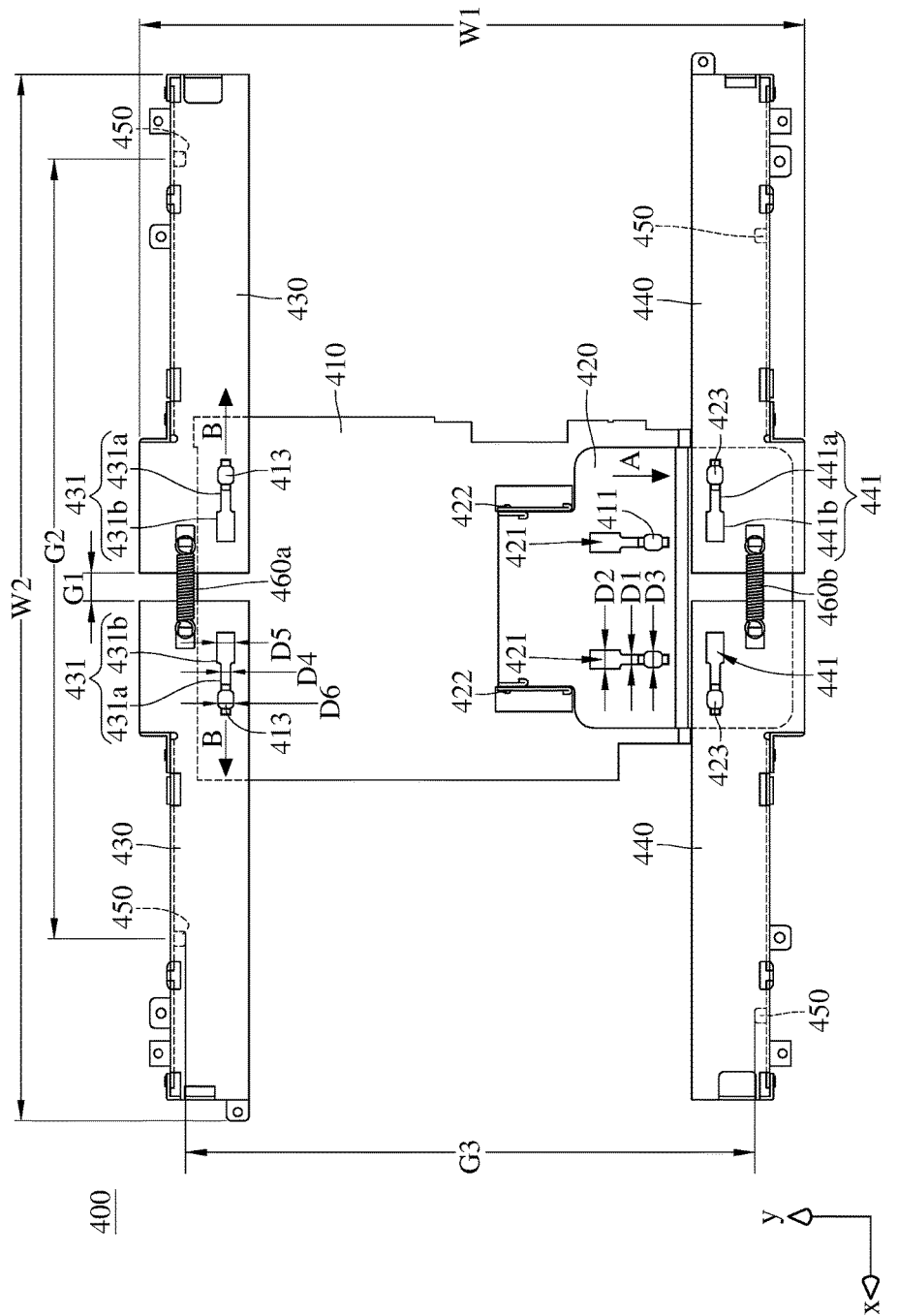
FIG. 5 is a bottom view of the adjustable frame in FIG. 2.

Please refer to FIG. 1 to FIG. 5. FIG. 1 is a perspective view of an electronic device according to a first embodiment. FIG. 2 is an exploded view of the electronic device in FIG. 1. FIG. 3 is a perspective view of the adjustable frame in FIG. 2. FIG. 4 is an exploded view of the adjustable frame in FIG. 3. FIG. 5 is a bottom view of the adjustable frame in FIG. 2. In this embodiment, an electronic device 10 includes a front case 100, a rear case 200, an output module 300 and an adjustable frame 400. The electronic device 10 is a screen in this embodiment, but the disclosure is not limited thereto. The electronic device 10 can be a tablet computer or an audio equipment in other embodiments.

The front case 100 and the rear case 200 are opposite to each other, and the front case 100 and the rear case 200 can be assembled to each other by a fastener. Both the front case 100 and the rear case 200, for example, are made of plastic or metal.

The output module 300 is a display panel in this embodiment, but the disclosure is not limited thereto. The output module 300 can be an audio speaker, a light source or a touch panel in other embodiments. The output module 300 is disposed between the front case 100 and the rear case 200, and the output module 300 includes a plurality of connecting members 310. The connecting member 310 is a recess located at an edge of the output module 300 in this embodiment, but the disclosure is not limited thereto. The connecting member 310 can be a hole capable of being fastened by a hook or a screw in other embodiments.

The adjustable frame 400 is disposed between the front case 100 and the rear case 200, and includes a plurality of supports which are slidable relative to each other. In detail, the adjustable frame 400 includes a first support 410, a second support 420, two third supports 430, two fourth supports 440 and a plurality of assembling members 450.

The second support 420 is disposed on the first support 410, and the second support 420 is slidable relative to the first support 410 along a first direction (the Y-axis in FIG. 5) for adjusting a first width W1 of the adjustable frame 400. In detail, the first support 410 includes at least one first sliding member 411, and the second support 420 includes at least one second sliding member 421. The first sliding member 411 and the second support 420 may be respectively a slide block and a groove which are formed by the punching process, or the first sliding member 411 and the second support 420 can be respectively a groove and a slide block. The first sliding member 411 is slidably disposed on the second sliding member 421. As seen in FIG. 5, the first sliding member 411 is able to slide relative to the second sliding member 421 toward the +Y direction for decreasing the first width W1, and the first sliding member 411 is also able to slide relative to the second sliding member 421 toward the −Y direction for increasing the first width W1.

The second sliding member 421 can include a fixing section 421a and a releasing section 421b that are connected to each other. A width D1 of the fixing section 421a is smaller than a width D2 of the releasing section 421b. A width D3 of the first sliding member 421 is larger than the width D1 of the fixing section 421a and is equal to or smaller than the width D2 of the releasing section 421b. Therefore, as seen in FIG. 5, the first sliding member 411 is inserted in the releasing section 421b and slides from the releasing section 421b into the fixing section 421a in a direction of arrow A so as to be assembled to the second sliding member 421.

As seen in FIG. 4, the first support 410 can include a plurality of first positioning members 412 arranged along the first direction (the Y-axis). The first positioning member 412 can be a hole. The second support 420 can include a second positioning member 422, and the second positioning member 422 can be a protrusion. The second positioning member 422 is fastened to one of the first positioning members 412 so as to fix the first support 410 to the second support 420.

The two third supports 430 are disposed on the first support 410, and the two fourth supports 440 are disposed on the second support 420. The first support 410, the second support 420, the two third supports 430 and the two fourth supports 440 together form the I-shaped adjustable frame 400. Both of the two third supports 430 are slidable relative to the first support 410 along a second direction (the X-axis in FIG. 5) perpendicular to the first direction, and both of the two fourth supports 440 are slidable relative to the second support 420 along the second direction; therefore, the two third supports 430 and the two fourth supports 440 are capable of adjusting a second width W2 of the adjustable frame 400.

In detail, in this embodiment, the first support 410 can include two third sliding members 413, and the second support 420 can include two third sliding members 423. Each of the two third supports 430 can include a fourth sliding member 431, and each of the two fourth supports 440 can include a fourth sliding member 441. Each of the third sliding members 413 and 423 can be a slide block formed by the punching process, and each of the fourth sliding members 431 and 441 can be a groove formed by the punching process; Or, the third sliding member 413, 423 can be a groove, and the fourth sliding member 431, 441 can be a slide block. The third sliding member 413 is assembled to and slidable relative to the fourth sliding member 431, and the third sliding member 423 is assembled to and slidable relative to the fourth sliding member 441. As seen in FIG. 5, the third sliding member 413 is able to slide relative to the fourth sliding member 431 along the X-axis so as to increase or decrease a distance G1 between the two third supports 430, and thereby adjusting the second width W2. The third sliding member 423 is able to slide relative to the fourth sliding member 441 so as to increase or decrease a distance between the two fourth supports 440, and thereby adjusting the width at the opposite side of the adjustable frame 400.

More specifically, the fourth sliding member 431 can include a fixing section 431a and a releasing section 431b which are connected to each other. A width D4 of the fixing section 431a is smaller than a width D5 of the releasing section 431b. A width D6 of the third sliding member 413 is larger than the width D4 of the fixing section 431a and is equal to or smaller than the width D5 of the releasing section 431b. Therefore, as seen in FIG. 5, the third sliding member 413 is inserted in the releasing section 431b and slides from the releasing section 431b into the fixing section 431a in a direction of arrow B so that the third sliding member 413 is able to be assembled to the fourth sliding member 431. The fourth sliding members 441 and 431 have similar structure and assemble mechanism with the third sliding members 413 and 423 so that the structure and the assemble mechanism of the fourth sliding members 441 and 431 are not repeated hereafter.

The adjustable frame 400 can further include two elastic members 460a and 460b in this embodiment. Two ends of the elastic member 460a that are opposite to each other are respectively connected to the two third supports 430, and two ends of the elastic member 460b that are opposite to each other are respectively connected to the two fourth supports 440. When both the elastic members 460a and 460b are not compressed or stretched, the elastic member 460a respectively positions the third sliding members 413 at the fixing sections 431a of the fourth sliding members 431, and the elastic member 460b respectively positions the third sliding members 423 at the fixing sections 441a of the fourth sliding members 441. Therefore, the two elastic members 460a and 460b are favorable for fixing the width of the adjustable frame 400 in the direction of the X-axis.

The assembling members 450 are disposed on the two third supports 430 and the two fourth supports 440, respectively, and the assembling member 450 corresponds to the connecting member 310 of the output module 300. In detail, the assembling member 450 is a protrusion capable of being fastened to the recess, but the disclosure is not limited thereto. In other embodiments, the assembling member 450 can be a hook or a screw capable of being fastened to a hole.

In this embodiment, as seen in FIG. 5, a distance G2 between two of the assembling members 450 is adjustable by the movement of the two third supports 430. That is, the two third supports 430 are slidable relative to the first support 410 along the second direction (the X-axis) for adjusting the distance G2 between the two assembling members 450 which are respectively located at the two third supports 430. Similarly, the two fourth supports 440 are slidable relative to the second support 420 for adjusting the distance between the two assembling members 450 which are respectively located at the two fourth supports 440. Moreover, the second support 420 is slidable relative to the first support 410 along the first direction (the Y-axis) for adjusting a distance G3 between the two assembling members 450 which are respectively located at the third support 430 assembled to the first support 410 and the fourth support 440 assembled to the second support 420. Therefore, it is favorable for assembling the adjustable frame 400 with different sized output modules.

Figure 6:
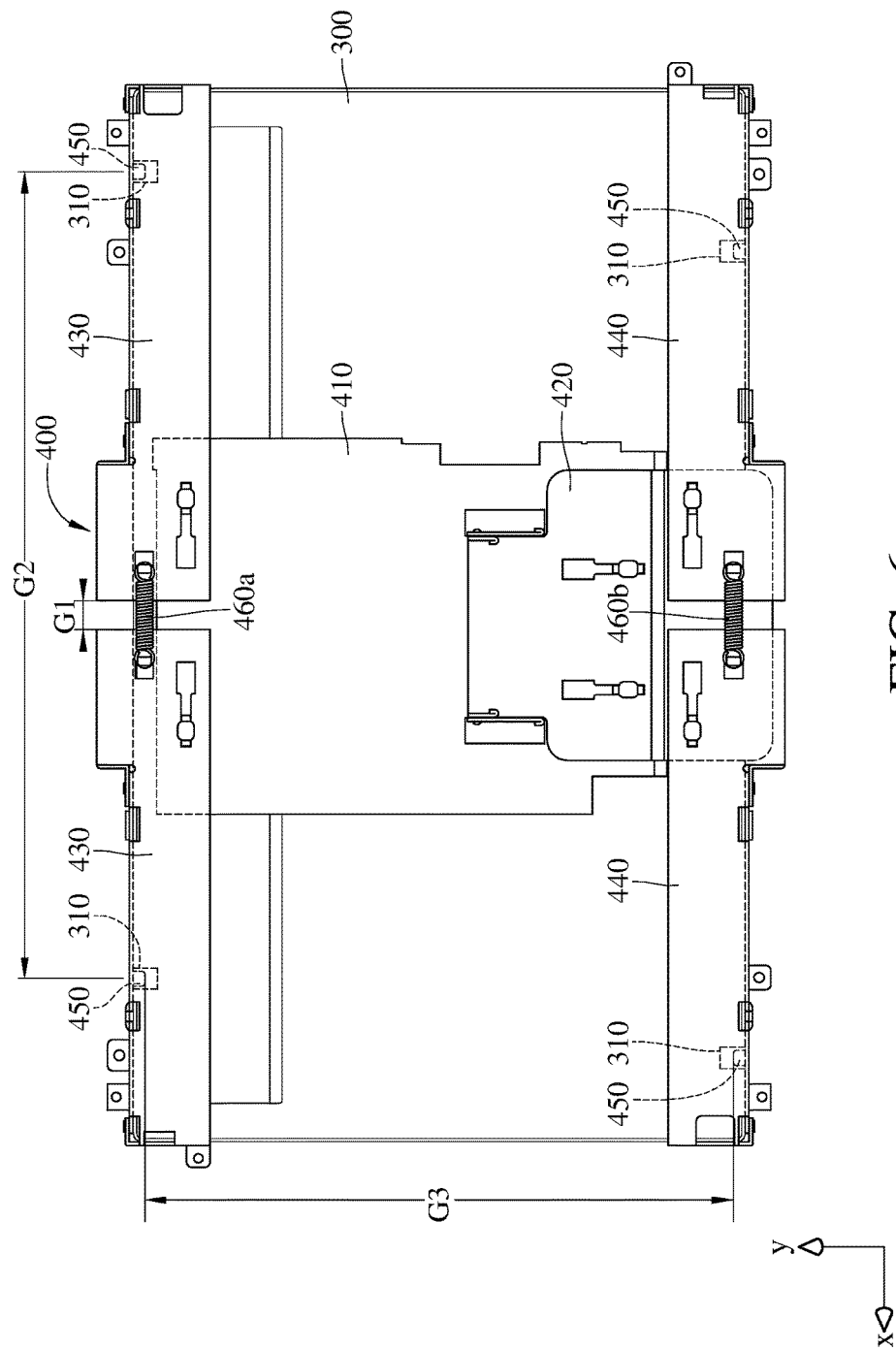
FIG. 6 is a bottom view of the adjustable frame assembled with an output module of the electronic device in FIG. 2.
Figure 7:
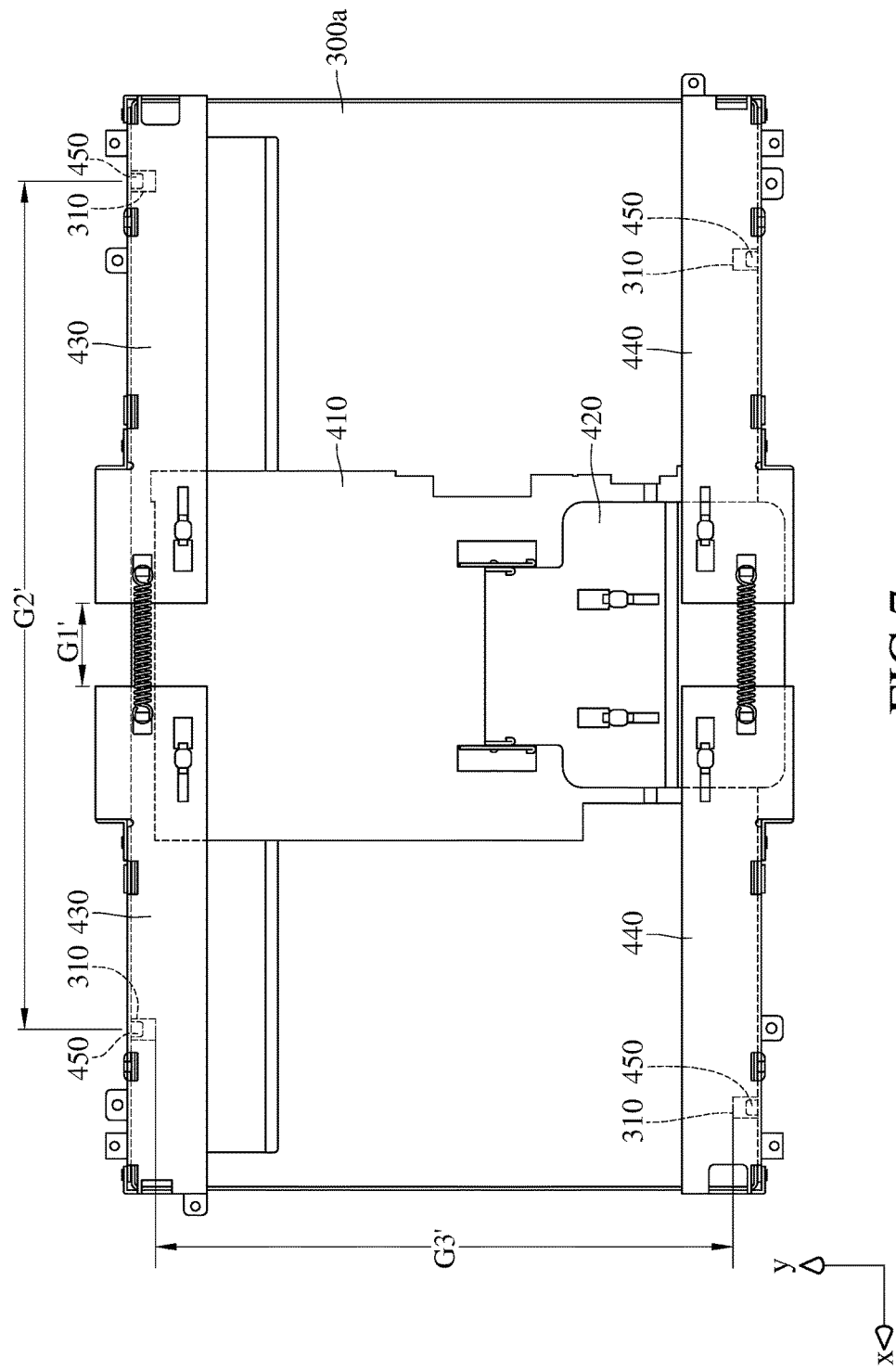
FIG. 7 is a bottom view of the adjustable frame assembled with another output module having different size from the output module in FIG. 6.

Please refer to FIG. 6 and FIG. 7. FIG. 6 is a bottom view of the adjustable frame assembled with an output module of the electronic device in FIG. 2. FIG. 7 is a bottom view of the adjustable frame assembled with another output module having different size from the output module in FIG. 6.

As seen in FIG. 6, the adjustable frame 400 is assembled to the output module 300. In detail, the distances G1 between the two third supports 430 and the two fourth supports 400 are fixed by the elastic member 460a so as to determine the distance G2 between the assembling members 450. Furthermore, the second positioning member 422 is fastened to the first positioning member 412 so as to fix the distance G3. Therefore, the distance G2 is equal to the distance between two adjacent connecting members 310 on the output module 300 in the direction of the X-axis, and the distance G3 is equal to the distance between two opposite connecting members 310 on the output module 300 in the direction of the Y-axis; thereby, the size of the adjustable frame 400 is proper for assembling with the output module 300.

As seen in FIG. 7, when assembling a different sized output module 300a, which is larger than the output module 300, to the adjustable frame 400, the third supports 430 are pulled away from each other and the fourth supports 440 are pulled away from each other so as to increase both of the distances between the third supports 430 and the fourth supports 440 from G1 to G1' in the direction of the X-axis, and thereby enlarging the distance between the adjacent assembling members 450 from G2 to G2'. Moreover, the user can detach the second positioning member 422 from the first positioning member 412 and slide the second support 420 to fasten the second positioning member 422 to another first positioning member 412, and thereby enlarging the distance of the opposite assembling members 450 from G3 to G3' in the direction of the Y-axis. Therefore, the size of the adjustable frame 400 is proper for assembling with the output module 300a which is larger than the output module 300.

In this embodiment, when the third supports 430 are pulled away from each other, and the fourth supports 440 are pulled are pulled away from each other, both the elastic members 460a and 460b are stretched so as to store elastic energy. When the adjustable frame 400 is assembled to the output module 300a, the assembling members 450 respectively press the side walls in the connecting members 310 due to a tendency of releasing the elastic energy, and thereby the assembling members 450 hold the output module 300a.

According to this embodiment, the second support 420 is slidable relative to the first support 410 along the first direction (the Y-axis) for adjusting the width W1 of the adjustable frame 400. Both the third support 430 and the fourth support 430 are slidable relative to the first support 410 and the second support 420, respectively, along the second direction (the X-axis) for adjusting the width W2 of the adjustable frame 400. Therefore, the size of the adjustable frame 400 is adjustable by the movements of the supports 410, 420, 430 and 440. By adjusting the size of the adjustable frame 400, different sized output modules are capable of being assembled to the adjustable frame 400 so that it is unnecessary to provide different sized frames for the output modules, and thereby the manufacturing process is simplified and the cost of preparing the frame is reduced.

Figure 8:
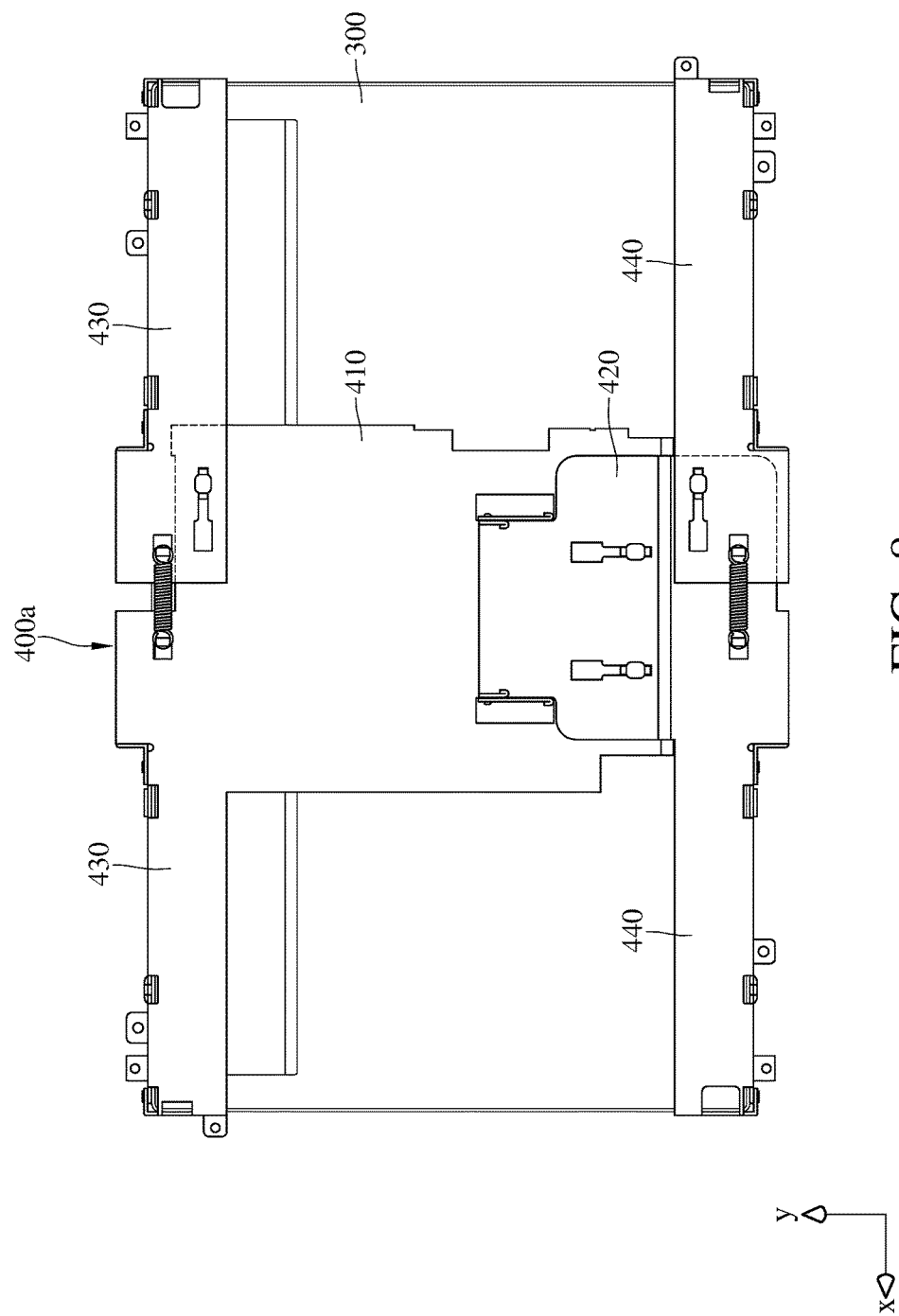
FIG. 8 is a bottom view of an adjustable frame assembled with an output module according to a second embodiment.

The two third supports and the fourth supports are all slidable along the first direction in the first embodiment shown in FIG. 1, but the disclosure is not limited thereto. Please refer to FIG. 8, which is a bottom view of an adjustable frame assembled with an output module according to a second embodiment. Since the second embodiment is similar to the first embodiment, only the differences between the first and the second embodiment will be illustrated hereafter.

In this embodiment, one of the third supports 430 of the adjustable frame 400a is slidably disposed on the first support 410, and another one of the third supports 430 is fixed to the first support 410. The third support 430 and the first support 410 that are fixed together can be integrally formed or two independent members that are fastened to each other. Furthermore, one of the fourth supports 440 of the adjustable frame 400a is slidably disposed on the second support 420, and another one of the fourth supports 440 is fixed to the second support 420. The fourth support 440 and the second support 420 that are fixed together can be integrally formed or two independent members that are fastened to each other.

Figure 9:
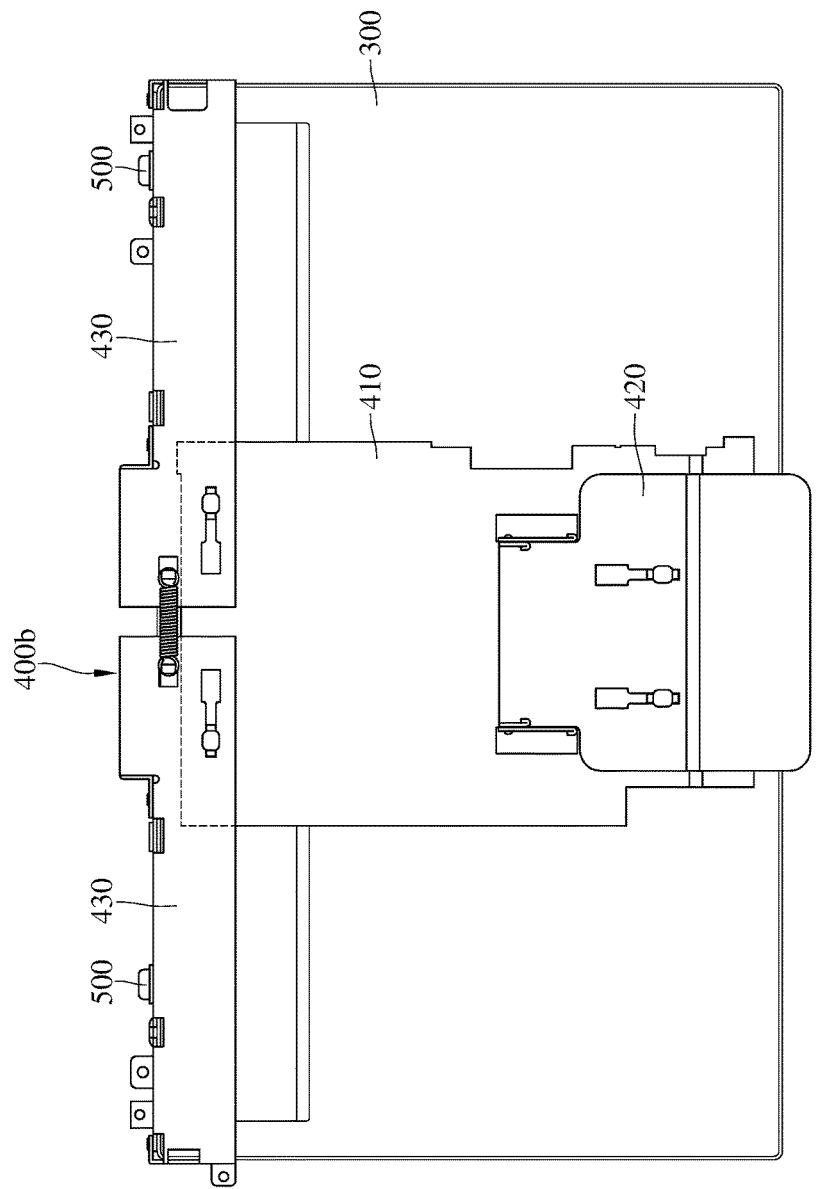
FIG. 9 is a bottom view of an adjustable frame assembled with an output module according to a third embodiment.

The fourth support is optional for the adjustable frame. Please refer to FIG. 9, which is a bottom view of an adjustable frame assembled with an output module according to a third embodiment. Since the third embodiment is similar to the first embodiment, only the differences will be illustrated hereafter.

In this embodiment, the adjustable frame 400b includes the third supports 430 without including the fourth support 440 so that the adjustable frame 400b shows a T shape. The two third supports 430 are slidable relative to the first support 410. The assembling members of the adjustable frame 400b, for example, are a plurality of holes. The adjustable frame 400b can be assembled to the output module 300 by screws 500.

Figure 10:
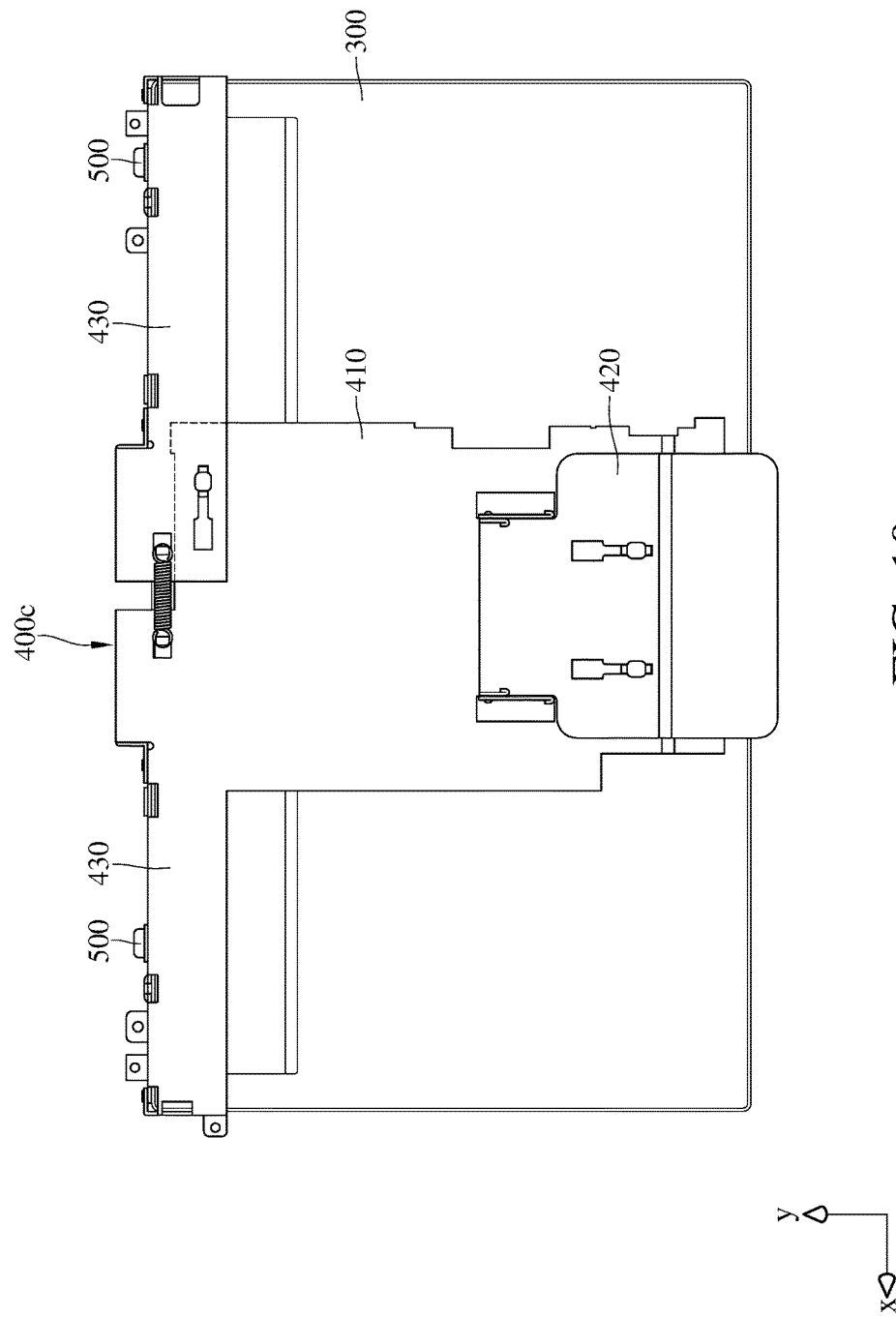
FIG. 10 is a bottom view of an adjustable frame assembled with an output module according to a fourth embodiment.

Please refer to FIG. 10, which is a bottom view of an adjustable frame assembled with an output module according to a fourth embodiment. Since the fourth embodiment is similar to the third embodiment, only the differences will be illustrated hereafter.

In this embodiment, one of the third supports 430 of the adjustable frame 400c is slidably disposed on the first support 410, and another one of the third supports 430 is fixed to the first support 410. The third support 430 and the first support 410 that are fixed together can be integrally formed or two independent members that are fastened to each other.

Figure 11:
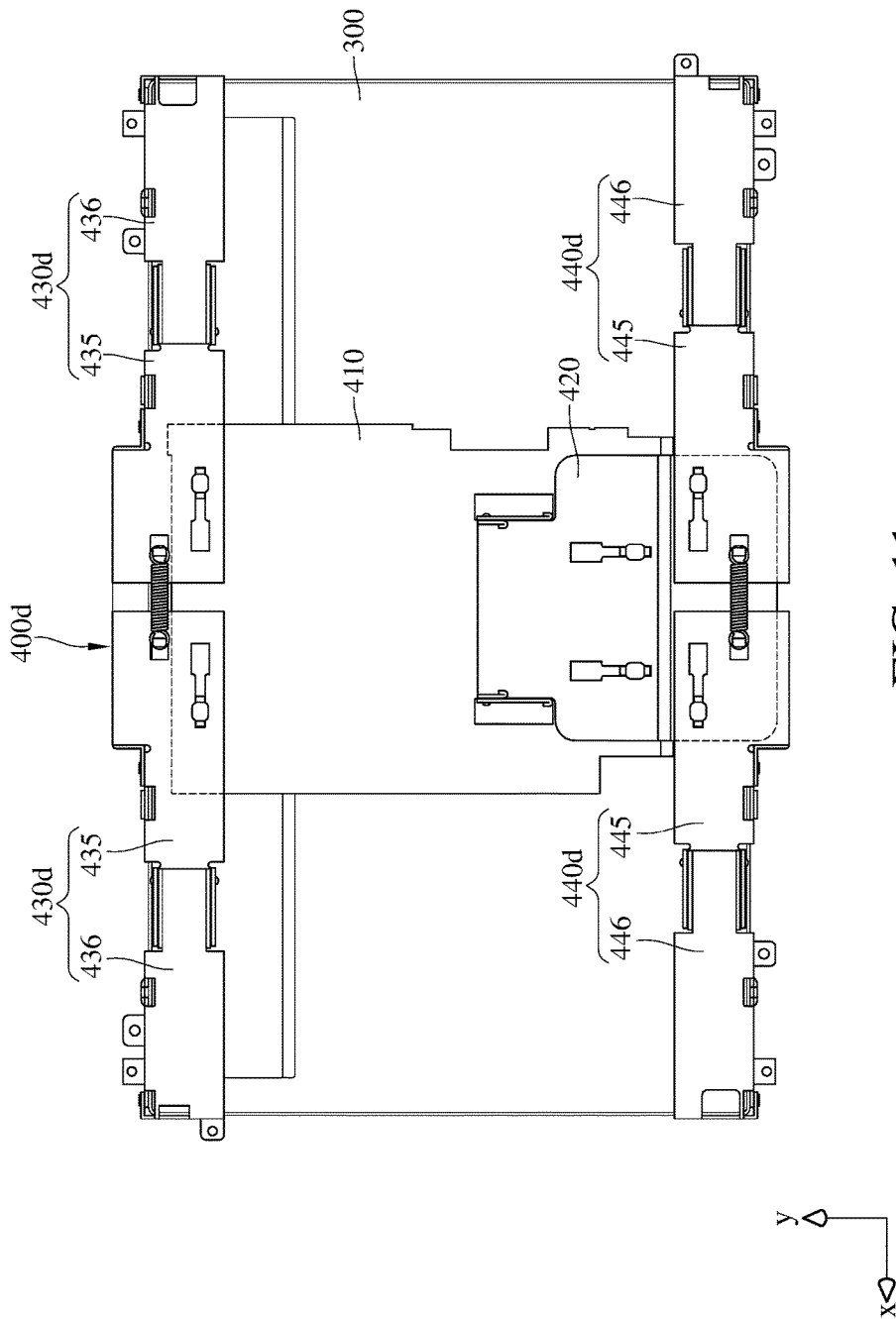
FIG. 11 is a bottom view of an adjustable frame assembled with an output module according to a fifth embodiment.

In the first embodiment, both the third support and the fourth support are a single plate, but the disclosure is mot limited thereto. Please refer to FIG. 11, which is a bottom view of an adjustable frame assembled with an output module according to a fifth embodiment.

Since the fifth embodiment is similar to the first embodiment, only the differences will be illustrated hereafter.

In this embodiment, each of the two third supports 430d includes a first part 435 and a second part 436. The first part 435 is slidably disposed on the first support 410, and the second part 436 is slidably disposed on the first part 435. Each of the two fourth supports 440d includes a first part 445 and a second part 446. The first part 445 is slidably disposed on the second support 420, and the second part 446 is slidably disposed on the first part 445. The position of the second part 436 at the first part 435 can be fixed by a protrusion and a recess or by an elastic member. Similarly, the second part 446 at the first part 445 can be fixed by a protrusion and a recess or by an elastic member. The method of fixing the second parts 436 and 446 to the first parts 435 and 445, respectively, by the protrusion and the recess can be a similar manner as the assembling method of the first positioning member 412 and the second positioning member 422 illustrated in the first embodiment. The method of fixing the second parts 436 and 446 to the first parts 435 and 445, respectively, by elastic member can be a similar manner as the assembling method of the two third supports 430 illustrated in the first embodiment.

In addition, the number of the first supports in the above embodiments is two, but the disclosure is not limited thereto. In other embodiments, the number of the first supports can be more than two.

According to the disclosure, the second support is slidable relative to the first support along the first direction, and the third support is slidable relative to the first support along the second direction perpendicular to the first direction. Therefore, the size of the adjustable frame is adjustable by the movements of the aforementioned supports. By adjusting the size of the adjustable frame, different sized output modules are capable of being assembled to the adjustable frame so that it is unnecessary to provide different sized frames for the output modules with different sizes, and thereby simplifying the manufacturing process and reducing the manufacturing cost.

The foregoing description, for the purpose of explanation, has been described with reference to specific embodiments; however. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. An adjustable frame, comprising: a first support; a second support disposed on the first support, and the second support being slidable relative to the first support along a first direction; two third supports disposed on the first support, at least one of the two third supports being slidably disposed directly on the first support in order to slide relative to the first support along a second direction perpendicular to the first direction for adjusting a distance between the two third supports; and two assembling members respectively disposed on the two third supports, and a distance between the two assembling members being adjustable by movement of the at least one of the two third supports; wherein the movement of the at least one of the two third supports in the second direction is independent from the movement of the second support in the first direction; and wherein the first support comprises at least one first sliding member, the second support comprises at least one second sliding member, and the at least one first sliding member is slidably disposed on the at least one second sliding member; and wherein the at least one first sliding member is one of a slide block and a groove, and the at least one second sliding member is the other one of the slide block and the groove; and wherein the first support comprises a plurality of first positioning members arranged along the first direction, the second support comprises a second positioning member, and the second positioning member is fastened to one of the plurality of first positioning members.

2. The adjustable frame according to claim 1, wherein the at least one first sliding member is the slide block, the at least one second sliding member is the groove, the at least one second sliding member comprises a releasing section and a fixing section that are connected to each other, a width of the at least one first sliding member is larger than a width of the fixing section, and the width of the at least one first sliding member is equal to or alternatively smaller than a width of the releasing section.

3. The adjustable frame according to claim 1, wherein one of the two third supports is fixed to the first support, and the other one of the two third supports is slidably disposed on the first support.

4. The adjustable frame according to claim 1, wherein the two third supports are slidably disposed on the first support.

5. The adjustable frame according to claim 4, wherein the first support comprises two third sliding members, each of the two third supports comprises a fourth sliding member, and the two third sliding members are slidably disposed on the two fourth sliding members, respectively.

6. The adjustable frame according to claim 5, wherein the third sliding member is one of a slide block and a groove, and the fourth sliding member is the other one of the slide block and the groove.

7. The adjustable frame according to claim 6, wherein the third sliding member is the slide block, the fourth sliding member is the groove, the fourth sliding member comprises a releasing section and a fixing section that are connected to each other, a width of the third sliding member is larger than a width of the fixing section, and the width of the third sliding member is equal to or alternatively smaller than a width of the releasing section.

8. The adjustable frame according to claim 7, further comprising an elastic member, wherein two ends of the elastic member that are opposite to each other are respectively connected to the two third supports for positioning the two third sliding members at the fixing sections of the two fourth sliding members, respectively.

9. The adjustable frame according to claim 1, wherein the assembling member is a protrusion, a hook or alternatively a hole.

10. The adjustable frame according to claim 1, further comprising two fourth supports disposed on the second support, wherein at least one of the two fourth supports is slidable relative to the second support along the second direction for adjusting a distance between the two fourth supports.

11. The adjustable frame according to claim 10, wherein one of the two fourth supports is fixed to the second support, and the other one of the two fourth supports is slidably disposed on the second support.

12. The adjustable frame according to claim 11, wherein the two fourth supports are slidably disposed on the second support.

13. The adjustable frame according to claim 1, wherein each of the two third supports comprises a first part and a second part, the first part is slidably disposed on the first support, and the second part is slidably disposed on the first part.

14. An electronic device, comprising:
a front case;
a rear case;
an output module disposed between the front case and the rear case, and the output module comprising a plurality of connecting members; and
the adjustable frame according to claim 1, the adjustable frame being disposed between the front case and the rear case, and the two assembling members being assembled to two of the plurality of connecting members, respectively.

15. The adjustable frame according to claim 1, wherein the two third supports and the second support are respectively located at two opposite sides of the first support.

16. The adjustable frame according to claim 1, wherein the two third supports respectively protrudes from two opposite edges of the first support.

17. The adjustable frame according to claim 1, wherein the second support is only slidable along the first direction, and at least one of the third supports is only slidable along the second direction.

\* \* \* \* \*